United States Patent

Bryant

(10) Patent No.: US 7,121,865 B2
(45) Date of Patent: Oct. 17, 2006

(54) SYSTEM AND METHOD FOR EXTRACTING A PROCESSOR FROM A SOCKET

(75) Inventor: David Bryant, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 121 days.

(21) Appl. No.: 10/782,161

(22) Filed: Feb. 19, 2004

(65) Prior Publication Data

US 2005/0186826 A1 Aug. 25, 2005

(51) Int. Cl.
*H01R 4/50* (2006.01)
*H01R 13/625* (2006.01)

(52) U.S. Cl. ........................................ 439/342; 439/68
(58) Field of Classification Search ................ 439/342, 439/73
See application file for complete search history.

(56) References Cited

U.S. PATENT DOCUMENTS 5,688,128 A * 11/1997 Ikeya ........................... 439/73
6,672,875 B1    1/2004  Mathieu et al. ............... 439/66
6,700,068 B1    3/2004  Hoffmeyer et al. ......... 174/250
6,726,500 B1 *  4/2004  McHugh et al. ............ 439/331
6,731,505 B1    5/2004  Goodwin et al. ........... 361/719
6,758,691 B1 *  7/2004  McHugh et al. ............ 439/331

* cited by examiner

*Primary Examiner*—Hae Moon Hyeon
(74) *Attorney, Agent, or Firm*—Hamilton & Terrile, LLP; Robert W. Holland

(57) ABSTRACT

A processor extraction device interacts with a processor to extract the processor from coupling between connectors of the processor and a socket, such as land grid array connectors that are susceptible to damage from dragging or rotational movement during extraction. For instance, adhesive couples the processor to a load plate that closes over the socket to compress the processor in the socket so that the adhesive extracts the processor as the load plate moves from the closed position to an open position distal the socket. As another example, the load plate closed position compresses the processor onto springs that bias the processor out of the socket upon movement of the load plate to the opened position.

16 Claims, 2 Drawing Sheets

SYSTEM AND METHOD FOR EXTRACTING A PROCESSOR FROM A SOCKET

BACKGROUND OF THE INVENTION

1. Field of the Invention

The present invention relates in general to the field of information handling system processors and sockets, and more particularly to a system and method for removing a processor from a socket.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling system performance generally increases in proportion to increases in the number and rate of calculations performed by a processor, which are generally increased through fabrication of greater numbers of transistors into, processor integrated circuits. However, increased operating speed and complexity of processor integrated circuits also calls for increased bus data transfer rates to and from memory and other devices to support processor operations. Traditionally processors connect to other devices through a motherboard that has wire line buses to communicate electronic signals. A socket coupled to the motherboard and in electronic communication with the buses accepts a processor by inserting processor "pins" extending from the outer edge of the processor package into socket openings. One difficulty that arises with the insertion of pins into a socket is that electromagnetic interference tends to distort data signals through lengthy pin connections, especially at higher bus data transfer rates. Another difficulty is that the number of pins that can extend from a processor is limited by the size of the processor's circumference.

In order to increase data transfer rates between a processor and motherboard, INTEL has developed a Socket-T that uses a land grid array (LGA) connector. LGA connectors extend from the bottom surface of a processor to permit a direct electrical connection between a module substrate and a motherboard. The bottom surface socket connection allows processors to have a higher density of pins, however, also provides less guidance for proper insertion of a processor package into a motherboard socket. Misdirected insertion of a processor package's LGA connector into a motherboard LGA socket or movement of the processor in the socket after insertion can cause damage to the LGA connectors and socket. In order to ensure firm connection of a LGA processor package into a LGA socket, the Socket-T arrangement applies a spring force against a load plate that forces a heat spreader along the outer edge of a processor against a processor socket. Although the Socket-T aids in proper alignment and firm coupling of LGA pins into a LGA socket, once a processor package is inserted into a socket, removal of the socket is often difficult. Removal of a processor package from a socket by hand sometimes introduces unintended rotation or dragging of the socket contacts, resulting in damage to the processor package or socket. To avoid rotational or dragging forces during removal of a LGA processor from a LGA socket, a vacuum tool is typically used to connect to the processor and lift the processor straight from the socket.

SUMMARY OF THE INVENTION

Therefore a need has arisen for a system and method which provides tooless removal of a processor from a socket with reduced risk of introduction of rotational or dragging forces to the processor relative to the socket.

In accordance with the present invention, a system and method are provided which substantially reduce the disadvantages and problems associated with previous systems and methods for removal of a processor from a socket. A processor extraction device extracts a processor from a socket to allow tooless removal of the processor with reduced risk of damage to processor and socket connectors from inadvertent dragging or rotation of the processor in the socket.

More specifically, a processor extraction device extracts a LGA processor from a LGA socket by coordinating extraction of the processor with movement of a load plate that compresses the processor into the socket from a closed position to an opened position. For instance an adhesive disposed between the load plate and processor couples the load plate to the processor so that the processor lifts from the socket as the load plate moves from the closed to the open position. As another example, springs disposed along the heat spreader of the processor compress at movement of the load plate to the closed position and provide a bias against the processor that extracts the processor from the socket as the load plate moves to the open position. In one embodiment, adhesive and one or more springs are used in combination so that the spring initiates movement of the processor from the socket and the adhesive grasps the processor to allow ease of access for manual grasping of the processor with the processor and socket connectors distal from each other.

The present invention provides a number of important technical advantages. One example of an important technical advantage is that tooless removal of a processor having LGA connectors from a LGA socket is supported with reduced risk of damage to the connectors and socket from dragging or rotational forces. Translating load plate movement into a removal force applied to the processor overcomes the residual socket connection force and frees the processor for tooless removal without subjecting the processor to dragging or rotational movement relative to the socket. Reduced introduction of dragging or rotational movement to the processor relative to the socket reduces the risk of damage to processor or socket connectors that result in failure of an information handling system.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Automatic and tooless extraction of a processor from a socket of an information handling system motherboard is provided by initiating a processor extraction device with movement of a load plate from a closed position that compresses the processor into the socket to an open position. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
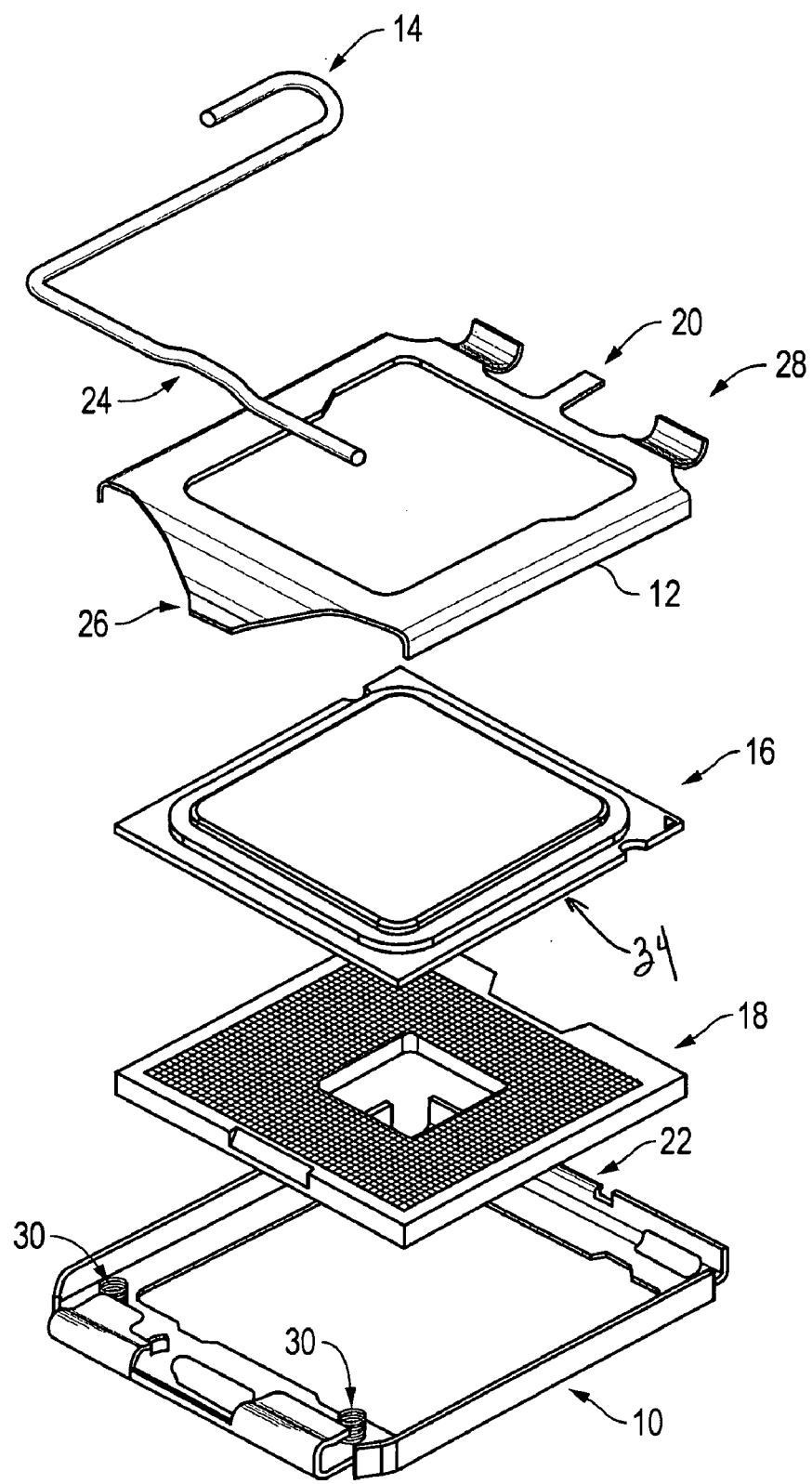
FIG. 1 depicts a blow-up view of a land grid array processor and socket having a processor extraction device.
Figure 2:
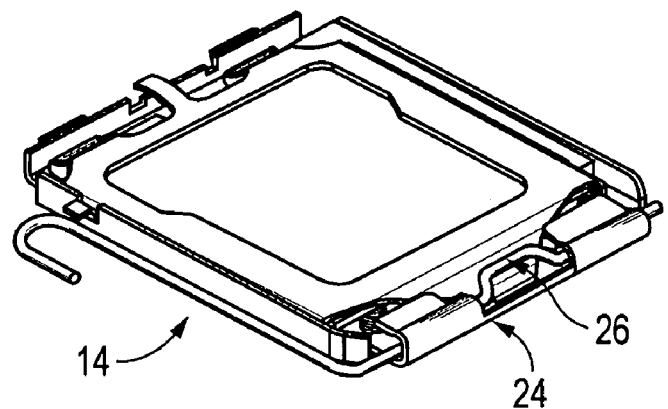
FIG. 2 depicts a land grid array processor in a closed position.

Referring now to FIG. 1, a blow-up view of a land grid array processor and socket having a processor extraction device is depicted. A socket frame 10 provides a stiff foundation body that couples to a circuit board, such as an information handling system motherboard. A load plate 12 rotationally couples to socket frame 10 and locks with a load lever 14 to encase a land grid array processor 16 and a socket body 18 within socket frame 10. Load plate 12 rotates about hinge hooks 20 engaged with hinge slots 22 from an open position to a closed position. In the closed position, depicted by FIG. 2, load lever 14 engages a load lever lock 24 with a load lever lock slot 26 so that load plate 12 compresses down upon processor 16 to engage the processor connectors with the socket connectors.

Once the processor and socket connectors are compressed together, movement of load plate 12 to an open position distal socket 18 exposes processor 16 for lifting out of socket 18. However, attempts to lift processor 16 by hand introduce rotational and drag forces that tend to damage the connectors. One type of processor extraction device that limits the risk of damage to connectors is an adhesive 28 disposed between load plate 12 and processor 16. Adhesive 28 couples processor 16 to load plate 12, such as at the heat spreader located at the outer circumference of processor 16, so that opening load plate 12 raises processor 16 away from socket 18 to allow manipulation of processor 16 by hand with reduced risk of damaging contact between the socket and processor land grid array connectors. Coupling of adhesive 28 is aided by compression of load plate 12 against socket frame 10. Release of processor 16 from adhesive 28 is managed by selection of an adhesive that has a desired retention force to maintain processor 16 coupled with load plate 12 until sufficient manual force is applied to ensure that inadvertent release does not occur.

Figure 3:
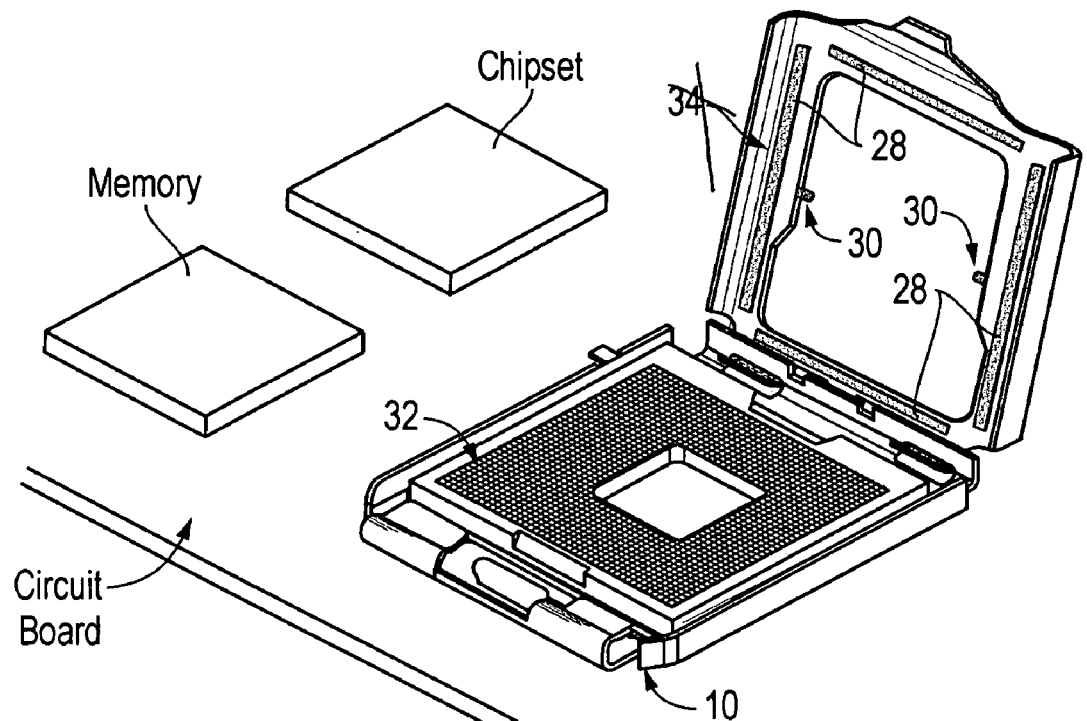
FIG. 3 depicts a land grid array processor in an open position.

Another example of an extraction device is one or more springs 30 aligned to apply an extraction force upon activation of load lever 14 to release compression of processor 16 by load plate 12. For example, as depicted by FIG. 1, springs 30 disposed about the circumference of processor 16 lift processor 16 as load plate 12 is released so that the processor and socket connectors are out of contact and the processor is accessible for manual movement. FIG. 3 depicts an extraction device that includes another arrangement of springs 30 and adhesive to extract processor 16 from socket 18 and hold processor 16 in load plate 12 for access by fingers. Spring 30 aligns on opposing sides of the heat spreader of processor 16 to apply a compressing force that extracts the processor as the load plate lifts. Alternatively, springs 30 may align beneath load plate 12 which translates the extraction force of spring 30 to processor 16 through the coupling provided by adhesive 28. As depicted by FIG. 3, when load plate 12 is in the open position with processor 16 adhered to load plate 12, socket LGA connectors 32 are held distal from processor LGA connectors 34.

Although the present invention has been described in detail, it should be understood that various changes, substitutions and alterations can be made hereto without departing from the spirit and scope of the invention as defined by the appended claims.

What is claimed is:

1. An information handing system comprising:
    plural components operable to process information;
    a motherboard interfacing the plural components to communicate the information;
    a socket frame coupled to the motherboard;
    a socket disposed within the socket frame and coupled to the motherboard, the socket having plural connectors in electrical communication with the motherboard;
    a processor coupled to the socket, the processor having plural connectors aligned to couple with the socket connectors;
    a load plate rotationally connected to the socket frame and operable to rotate between a closed position and an opened position over the processor, the load plate closed position compressing the processor connectors into the socket connectors; and
    a processor extraction device connected to the load plate and operable to removably couple to the processor, the processor extraction device removing the processor from the socket by movement of the load plate from a closed to an open position.

2. The information handling system of claim 1 wherein the processor comprises a central processing unit.

3. The information handling system of claim 2 wherein the processor connectors and socket connectors comprise land grid array connectors.

4. The information handling system of claim 1 wherein the processor extraction device comprises an adhesive disposed between the load plate and the processor, the adhesive coupling the load plate to the processor during movement of the load plate from the closed to the open position.

5. A method for extracting a processor from a socket, the method comprising:
  rotating a load plate about a socket connection point from a closed position that compresses the processor into the socket to an open position;
  removably coupling the processor to the load plate with an extraction device integrated with the load plate by compression of the processor by the load plate in the closed position; and
  extracting the processor from the socket with the extraction device by the rotation of the load plate from the closed position to the open position.

6. The method of claim 5 wherein the extraction device comprises adhesive and extracting the processor from the socket further comprises:
  coupling the processor to the load plate with the adhesive; and
  lifting the processor from the socket by movement of the load plate away from the socket.

7. The method of claim 5 wherein extracting the processor from the socket further comprises:
  decompressing a spring disposed under the processor by moving the load plate from the closed to the open position; and
  pushing the processor from socket by decompression of the spring.

8. The method of claim 7 wherein moving the load plate decompresses plural springs disposed around a heat spreader of the processor to apply a substantially even pushing force for extracting the processor from the socket.

9. The method of claim 5 wherein the extraction device comprises springs integrated with the load plate and aligned to couple to the processor and wherein extracting the processor from the socket further comprises:
  adhering the processor to the load plate with the springs to lift the processor from the socket by translation of lifting motion applied to the load plate.

10. The method of claim 5 wherein the processor and socket couple by land grid array connectors.

11. A system for extracting a processor from a processor socket, the system comprising:
  a socket frame operable to couple to a circuit board proximate the processor socket;
  a load plate rotationally connected to the socket frame and operable to rotate between a closed position that compresses the processor and an open position that exposes the processor socket; and
  a processor extraction device integrated in the load plate and operable to automatically extract the processor from the processor socket by rotation of the load plate from the closed position to the open position.

12. The system of claim 11 wherein the processor extraction device comprises plural springs operable to engage with the processor in the closed position and to apply an extraction force to the processor if the load plate transitions to the opened position by removably coupling the processor to the load plate.

13. The system of claim 11 wherein the processor extraction device comprises adhesive operable to couple the processor to the load plate.

14. The system of claim 13 further comprising one or more springs aligned to bias the processor out of the socket.

15. The system of claim 11 further comprising:
  a land grid array socket disposed in the socket frame; and
  a land grid array processor coupled to the socket.

16. The system of claim 15 wherein the processor comprises a central processor unit.

* * * * *